(12) United States Patent
Zang et al.

(10) Patent No.: US 11,244,979 B2
(45) Date of Patent: Feb. 8, 2022

(54) DEEP TRENCH ISOLATION (DTI) STRUCTURE FOR CMOS IMAGE SENSOR

(71) Applicant: OMNIVISION TECHNOLOGIES, INC., Santa Clara, CA (US)

(72) Inventors: Hui Zang, San Jose, CA (US); Gang Chen, San Jose, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 49 days.

(21) Appl. No.: 16/720,236

(22) Filed: Dec. 19, 2019

(65) Prior Publication Data

US 2021/0193702 A1 Jun. 24, 2021

(51) Int. Cl.
*H01L 27/146* (2006.01)

(52) U.S. Cl.
CPC .... *H01L 27/1463* (2013.01); *H01L 27/14629* (2013.01); *H01L 27/14643* (2013.01); *H01L 27/14689* (2013.01)

(58) Field of Classification Search
CPC ........... H01L 27/1463; H01L 27/14629; H01L 27/14643; H01L 27/14689
See application file for complete search history.

(56) References Cited

U.S. PATENT DOCUMENTS

| | | | |
|---|---|---|---|
| 10,181,490 B2 | 1/2019 | Watanabe et al. | |
| 10,204,951 B2 | 2/2019 | Watanabe et al. | |
| 10,276,620 B2 | 4/2019 | Chien et al. | |
| 2012/0217601 A1* | 8/2012 | Miyanami | H04N 9/083 257/432 |
| 2014/0015085 A1* | 1/2014 | Ikeda | H01L 27/14689 257/432 |
| 2015/0155327 A1* | 6/2015 | Kuboi | H01L 27/14638 348/273 |
| 2015/0221692 A1* | 8/2015 | Enomoto | H01L 27/1464 257/435 |
| 2015/0243805 A1 | 8/2015 | Chien et al. | |
| 2016/0204150 A1* | 7/2016 | Oh | H01L 27/14638 257/229 |
| 2018/0359434 A1* | 12/2018 | Tanaka | G02B 5/20 |
| 2019/0165026 A1* | 5/2019 | Kuo | H01L 27/1463 |
| 2021/0013249 A1* | 1/2021 | Yang | H01L 27/14609 |
| 2021/0084250 A1* | 3/2021 | Miyamori | H01L 27/14621 |

* cited by examiner

Primary Examiner — Scott B Geyer

(74) Attorney, Agent, or Firm — Christensen O'Connor Johnson Kindness PLLC

(57) ABSTRACT

A semiconductor structure for a CMOS image sensor includes a semiconductor substrate having a first side and a second side. A photodiode is disposed in the semiconductor substrate proximate to the first side. The photodiode accumulates image charge photogenerated in the photodiode in response to incident light directed through the second side. A deep trench isolation structure enclosing the photodiode. The deep trench isolation structure extends from the second side toward the first side. The deep trench isolation structure includes a light absorption region disposed at a first end of the deep trench isolation structure toward the first side.

21 Claims, 6 Drawing Sheets

US 11,244,979 B2

DEEP TRENCH ISOLATION (DTI) STRUCTURE FOR CMOS IMAGE SENSOR

BACKGROUND INFORMATION

Field of the Disclosure

This disclosure relates generally to image sensors, and in particular but not exclusively, relates to isolation structures in image sensors.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The technology used to manufacture image sensors has continued to advance at a great pace. The demands of higher resolution and lower power consumption have encouraged the further miniaturization and integration of these devices. As the demand for image sensors continues to be rise, high packing density with isolation as well as low noise performance of the pixel cells in the image sensors have become increasingly challenging.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
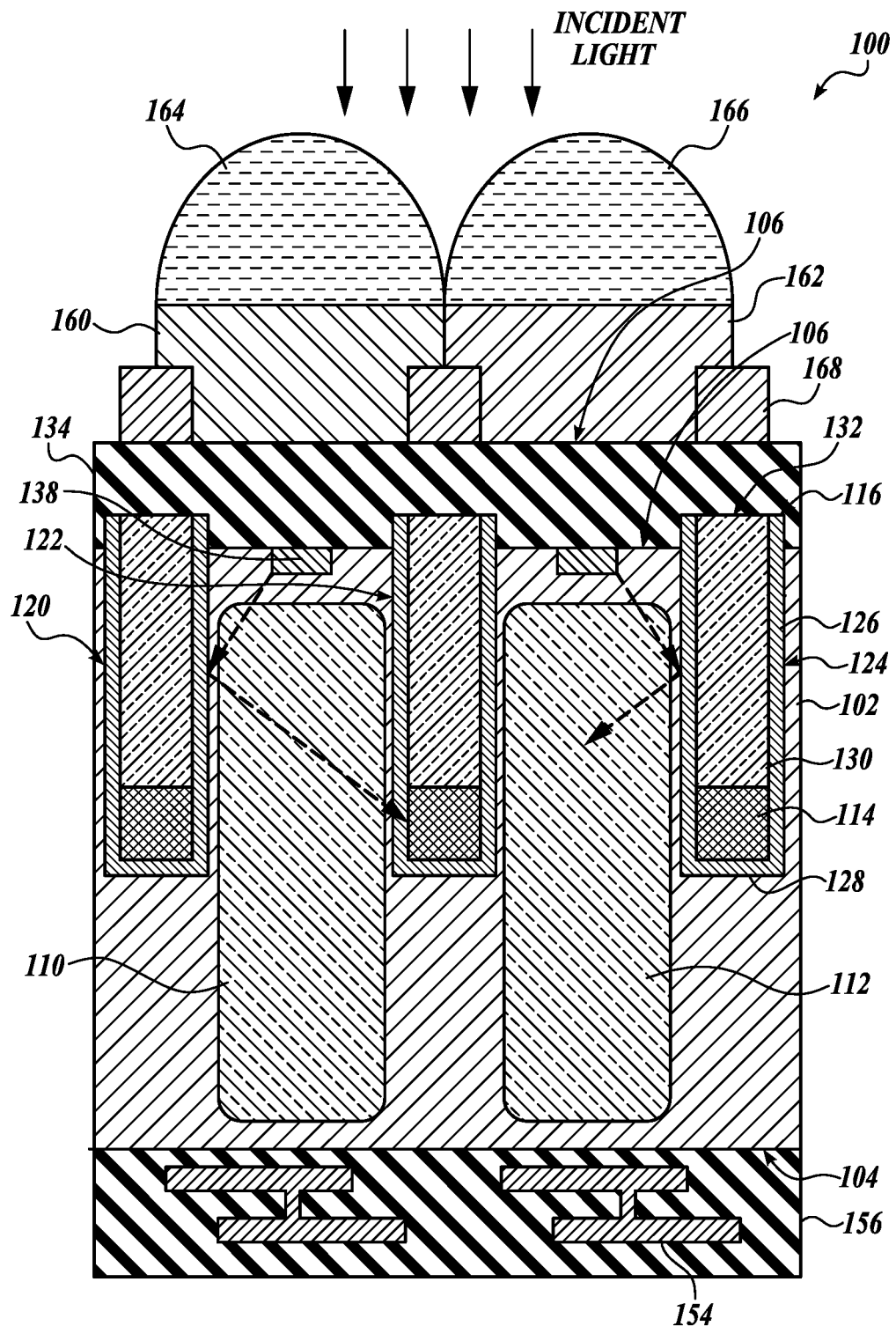
FIG. 1 is a cross-sectional illustration of one example of a semiconductor structure having a deep trench isolation structure for a CMOS image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Apparatuses and methods directed to deep trench isolation structures for CMOS image sensors, for example, are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example and embodiment. Furthermore, the particular features, structures, or characteristics may be combined in any suitable manner in one or more examples and embodiments.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. Additionally, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that names of chemical elements and their symbols may be used interchangeably through this document (e.g., Si vs. silicon); however, both have identical meaning.

One approach to isolating photo carriers is to use a deep trench isolation (DTI) structure formed from a dielectric material to enclose each photodiode. However, some incident light can penetrate through the dielectric-filled DTI and generate crosstalk in adjacent photodiodes.

Another approach is to use a DTI structure lined with a dielectric material to isolate the photo carrier and which is also filled with a reflective metal to reflect the light to stay within the DTI structures. However, light that strikes the reflective metal at a high or large angle of incidence results in reflected light that can cross into the adjacent photodiode. A high angle of incidence means an angle near to normal to the reflective metal surface. A low angle of incident refers to light near to normal to the illuminate plane, i.e., the front surface. Light with a high angle of incidence can increase the quantum efficiency (QE) by having reflection in the top and middle metal portion of the deep trench isolation structure increasing light absorption path.

As will be discussed, examples in accordance with the teachings of the present invention are directed to an image sensor having a DTI structure that isolates adjacent photodiode regions. In various examples, the DTI structure is formed on the backside of the semiconductor substrate and extends from the backside surface depthwise into the semiconductor substrate toward the front side of the semiconductor substrate. The semiconductor substrate may be to a bulk silicon substrate, an epitaxial substrate, or doped silicon substrate e.g., P-type doped silicon substrate or N-type doped silicon substrate, a silicon on insulator (SOI) substrate. In some embodiments, the semiconductor substrate may include one or more of doped semiconductor regions and/or undoped semiconductor regions, epitaxial layers of silicon, and other semiconductor structures formed upon the substrate.

In one example, the DTI structure includes at least one light absorption region as well as a reflective region. The light absorption region can be placed at or near to the greatest depth of the DTI structure. The light absorption region is configured to absorb stray light, which reduces light with a high incident angle from straying over to adjacent photodiode regions. Incident angle is the angle of the incident light with respect to a line normal to the surface. The reflective region is configured to reflect or isolate incoming light to remain between the adjacent DTI structures, which improves light absorption in the photodiode region that is disposed between the DTI structures and therefore improves the quantum efficiency (QE) of the photodiode region in accordance with the teachings of the present invention. In particular, the light absorption region at the end or near to the greatest depth of the DTI structure can eliminate the optical crosstalk from reflected light striking the DTI structure at high angles of incidence, for example.

To illustrate, FIG. 1 shows a cross section of a pixel structure 100 that may be used in image sensors for isolating the photodiode regions. The pixel structure 100 has a semiconductor substrate 102 with a first side 104 (front side) and a second side 106 (backside) opposite to the first side 104. In some embodiments, the first side 104 is refer to as an non-illuminated side the pixel structure 100, and the second side 106 is refer to as an illuminated side of the pixel structure 100. The pixel structure 100 has at least one photodiode 110 and 112 disposed in the semiconductor substrate 102 proximate to the first side 104, wherein the photodiodes 110 and 112 accumulate image charge photo-generated in the respective photodiode in response to incident light directed thereto through the second side 106. The pixel structure 100 has a deep trench isolation structure 116 enclosing semiconductor regions in the semiconductor substrate 102, where photodiodes e.g., the photodiodes 110 and 112 are disposed, and provides electrical and optical isolation between neighboring photodiodes 110 and 112, and 114 wherein the deep trench isolation structure 116 extend depthwise from the second side 106 toward the first side 104 i.e., the deep trench isolation structure 116 extends a first distance from the second side 106 toward the first side 104 so that the deep trench isolation structure is less than a thickness of the semiconductor substrate 102 between the first side 104 and the second side 106. Stated differently, the region between a first end 128 of the deep trench isolation structure 116 toward the first side 104 and the first side 104 is comprised of the semiconductor substrate 102. In some embodiments, the deep trench isolation structure 116 extends to the first side 104 and the bottom of the deep trench isolation structure 116 is co-planar with a surface of first side 104. In some embodiments, the bottom of the deep trench isolation structure 116 is at least 1 μm away from the first side 104 avoiding over-etching causing damages to pixel circuitry formed at first side 104. The deep trench isolation structure 116 includes a light absorption region 114 disposed at a first end 128 of the deep trench isolation structure 116 toward the first side 104. The first end 128 of the deep trench isolation structure 116 is the end at or near to the greatest depth of the deep trench isolation structure 116.

A buffer oxide layer 134 is formed on the second side 106. A metal grid 168 is formed of a plurality of intersecting metal structures on the buffer oxide layer 134 having a plurality of openings for color filter material deposition. An array of color filters 160, 162, for example, arranged in Bayer's pattern RGGB, is formed on the buffer oxide layer 134, such that each color filter 160, 162 is formed between the openings in the metal grid 168. Restated, the metal grid 168 is positioned between individual color filters 160, 162 in the array of color filters and disposed to surround individual color filters 160, 162. An array of microlenses 164, 166 is formed on the array of color filters 160, 162, such that each microlens 164, 166 is formed on a respective color filter 160, 162 to direct incoming light through the respective color filters 160, 162 to the respective photodiode region 110, 112. The microlenses 164, 166 may be aligned to the center line of the adjacent metal structure of the metal grid 168. These structures are fabricated in the typical order. A portion of the incoming light directed by microlenses 164, 166 to the respective color filters 160, 162 that is oblique to surface normal of semiconductor substrate 102 may be reflected by metal grid 168 onto respective photodiodes 110, 112 and/or the deep trench isolation structure 116 in semiconductor substrate 102 through the second side 106.

In one embodiment, the deep trench isolation structure 116 is fabricated from a series of trenches extended from the second side 106 depthwise (for example, the first distance) into semiconductor substrate 102. In one example, the first distance is less than the thickness of the semiconductor substrate 102. In one example, the first distance is at least equal to the thickness of the semiconductor substrate 102. Specifically, in one embodiment, the deep trench isolation structure 116 is fabricated by forming a plurality of trenches aligned in a first direction intersecting with a plurality of trenches aligned in a second direction forming a trench grid. In one embodiment, the first distance that each of the series of trenches of the deep trench isolation structure 116 extended into semiconductor substrate 102 may range from 2 μm to 5 μm depending on the thickness of semiconductor substrate 102. In embodiments, each of photodiodes 110 and 112 is disposed in a semiconductor region enclosed by intersecting trenches of the deep trench isolation structure 116. Each of photodiodes 110 and 112 may be surrounded by the intersecting trenches of the deep trench isolation structure 116. Restated, each of the intersecting trenches of the deep trench isolation structure 116 is disposed between adjacent photodiodes 110, 120, to provide electrical and optical isolation between adjacent photodiodes 110, 120.

In the illustrated example, each of photodiodes 110 and 112 is illustrated with a box shaped structure for simplicity. Those skilled in the art should appreciate that each of photodiodes 110 and 112 may include a doped region implanted with a dopant having conductive type opposite to the semiconductor substrate 102 on the first side 104 into the semiconductor substrate 102 depthwise by ion implantation process. In one embodiment, the doped region of photodiode may be formed by implanting n-type dopants of arsenic (As) or phosphorus a number of times with different implant energy into the semiconductor substrate 102, which is a p-type doped semiconductor substrate, to obtain a desired doping profile for achieving a desired full well capacity. However, in another example, the polarity of the layers/regions may be reversed, for example, the doped region of photodiode may be formed of p-type dopants of boron (B) into the semiconductor substrate 102, which is an n-type semiconductor substrate. The doped region of the photodiode may have a shape, such as square, rectangular, circular, or any suitable shape as well as size (e.g., length and width of photodiode implant region) configured based on the design requirement and pixel size for the respective image sensor so long as each of photodiodes 110 and 112 is formed within the respective region enclosed by the deep isolation structure 116 according with the teachings of the present invention. In addition, each of photodiodes 110 and 112 may be a partially pinned photodiode, or a pinned photodiode.

In one example, pixels with photodiode regions 110 and 112 can be arranged in an array having a series of horizontal rows (e.g., R1 to Ry) and vertical columns (e.g., C1 to Cx), but, the array has one level of pixels along the depth. (See also FIG. 12 below). Therefore, to isolate any one pixel from the surrounding pixels, the deep trench isolation structure 116 enclosing each pixel can have four sides. Furthermore, to isolate each of the pixels and the photodiode regions 110 and 112 when laid out in the array, a simple method of fabricating deep trench isolation structures 116 for each pixel includes forming a grid of horizontal trenches intersecting with vertical trenches. In one example, the outer horizontal and vertical trenches of the grid may be omitted so that pixels on the outer perimeter of the array may be provided with a three-sided isolation structure, except that pixels on the corner of the array may be provided with a two-sided isolation structure. However, any pixel in the array can be enclosed on four sides by the series of trenches of deep trench isolation structure 116.

It is understood that the deep trench isolation structure 116 can refer to the entirety of the grid structure or any part thereof. Furthermore, any part of the deep trench isolation structure 116 can be fabricated according to different embodiments, such that certain trenches can be fabricated according to a first embodiment, and other trenches can be fabricated according to a different embodiment.

It is appreciated that the specific placement of each of the photodiode regions 110 and 112 in an array is arbitrary to illustrate the present invention. In the example of FIG. 1, the three illustrated trenches 120, 122, and 124, therefore, are aligned with vertical grid lines of the array. (See also FIG. 12). Furthermore, when the trenches 120, 122, and 124 represent vertical grid lines, a cross-sectional view of the pixel structure 100 that is at a right angle from the view of FIG. 1 would show a similar series of trenches but representing horizontal grid lines.

In one embodiment, for any one of the photodiodes 110 and 112, the deep trench isolation structure 116 can enclose the photodiode 110 and 112 in a four-sided structure having a trench on each lateral side, wherein each trench is orthogonal to the first side 104 and the second side 106 of the semiconductor substrate 102, and wherein each trench intersects two other trenches at substantially right angles.

As illustrated in FIG. 1, one embodiment of a deep trench isolation structure 116 includes a dielectric layer 126 lining the sides and bottom of the trench 124, wherein the dielectric layer 126 is juxtaposed next to the semiconductor substrate 102. In one embodiment, the depth of the trench 124 from the second side 106 into the depth of the semiconductor substrate 102 does not reach to the first side 104, so that the region from the end 128 of the trench 124 to the first side is formed of the semiconductor substrate 102. The dielectric layer 126 is, for example, silicon oxide or any high K material. In one embodiment, the dielectric layer 126 includes one or a combination from the following: silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), a combination thereof or other suitable dielectric material. The dielectric layer 126 may be a single layer or multi-liner layer stack. In one embodiment, the dielectric layer 126 may be formed of a single layer of silicon oxide. In one embodiment, the dielectric layer 126 may be formed of silicon oxide and at least a high k oxide material such as aluminum oxide forming a multi-liner layer stack.

In one embodiment, the dielectric layer 126 has an average thickness from 10 nm to 100 nm. The trench 124 width can be predetermined according to the width of the dielectric layer 126 to be deposited. In one embodiment, the average width of the trench 124 is from 1 μm to 3 μm. In any case, the trench 124 width is made large enough so that even considering the thickness of the dielectric layer 126, there will be a depthwise recess remaining in the trench 124 to allow the recess to be filled with one or more light adsorption materials and one or more light reflective materials of the desired width.

In FIG. 1, one embodiment of the deep trench isolation structure 116 includes a light absorption region 114 disposed at the bottom end 128 of the trench 124 toward the first side 104 of the semiconductor substrate 102. The light absorption region 114 is disposed on the dielectric layer 126, and the light absorption region 114 fills the bottom and sides of the trench 124 to a certain depth. It is understood that the light absorption region 114, as well as the dielectric layer 126, fills the trench 124 throughout the length of the trench 124.

In one embodiment, the depthwise dimension of the light absorption region 114 is from 5% to 15% the depth of the deep trench isolation structure 116 which includes the dielectric layer 126 such that the light absorption region 114 with a depthwise height that is sufficient to absorb incident light with high angle (referred to as the stray light) preventing such light from straying over to neighboring photodiodes while not causing much impact to the quantum efficiency or light sensitivity of the photodiode 110, 112 disposed between deep trench isolation structures 116. Those skilled in the art should appreciate that information contained in stray light (e.g., light with high or large incident angle) may add little or no value to the respective photodiode, but could contribute as noise to the neighboring photodiodes affecting light sensitivity of the neighboring photodiodes. For example, a light with high angle directed to photodiode 112 may not add much imaging information to the photogenerated response of photodiode 112, but could stray over and affect the photogenerated response of a neighboring photodiode, for example, the photogenerated response of photodiode 110. In one embodiment, the depthwise dimension of the light absorption region 114 is about 1000 Å to about 7500 Å.

In one embodiment, the light absorption region 114 includes tungsten (W), titanium, titanium nitride (TiN), aluminum (Al), nickel (Ni), alloys, or any combination thereof configured with sufficient thickness (or the height with respect to the deep trench isolation structure 116) of light absorption. Other light absorption materials can be used, including materials that can be subjected to reactive ion etching or wet etching processes.

In FIG. 1, one embodiment of the deep trench isolation structure 116 includes a light reflective region 130 disposed between the light absorption region 114 and a second end 132 of the deep trench isolation structure 116, wherein the second end 132 of the deep trench isolation structure 116 is the end at or near the lowest depth of the deep trench isolation structure 116 toward the second side 106 of the semiconductor substrate 102. Particularly, the light reflective region 130 is disposed on the light absorption region 114 and juxtaposed on the dielectric layer 126 on the sides of the trench 124. Restated, the light absorption region 114 may be embedded in the deep trench isolation structure 116 by the dielectric layer 126 and light reflective region 130. Incident light with high angle entering the photodiode region enclosed by trenches 120, 122, 124 of the deep trench isolation structure 116 can be reflected in the top (portion at the lowest depth with respect to second side 106) and/or middle portions of the deep trench isolation structure 116 to increase the light absorption of the photodiode located between the adjacent trenches 120, 122, 124 of the deep trench isolation structure 116, therefore improve corresponding quantum efficiency of the respective photodiode 110 and 112, particularly to longer wavelength such as near infrared light, and at the same time any stray light is absorbed at the bottom portion (portion at the greatest depth with respect to second side 106) of the deep trench isolation structure 116 preventing crosstalk.

In one embodiment, the light reflective region 130 includes aluminum (Al), copper, silver, platinum, a metal alloy, or any combination thereof.

Optionally, a barrier layer may be disposed between dielectric layer 126, and the stack structure of light reflective region 130 and light absorption region 114 to prevent metal ions diffusion. The barrier layer may include formed of titanium (Ti), titanium nitride (TiN), or a combination thereof.

Figure 2:
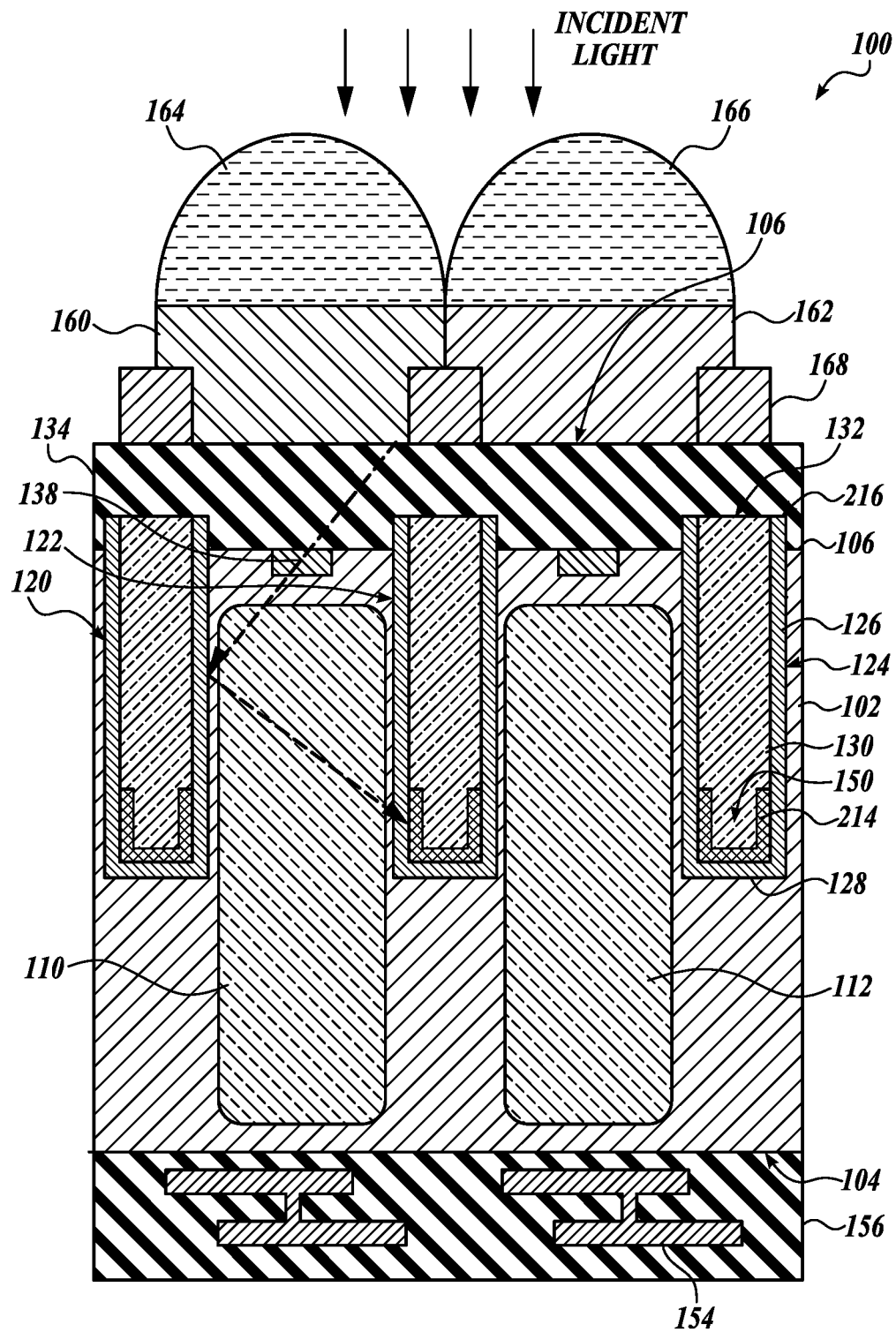
FIG. 2 is a cross-sectional illustration of another example of a semiconductor structure having a deep trench isolation structure for a CMOS image sensor in accordance with the teachings of the present invention.

In FIG. 2, an embodiment of a deep trench isolation structure 216 is illustrated that is similar to the embodiment illustrated in FIG. 1 with respect to materials and general dimensions with a difference being that the light absorption region 214 includes a recess 150 extending from the top surface of the light absorption region 214 down toward the end 128 of the deep trench isolation structure 216, but not penetrating through the dielectric layer 126.

Figure 3:
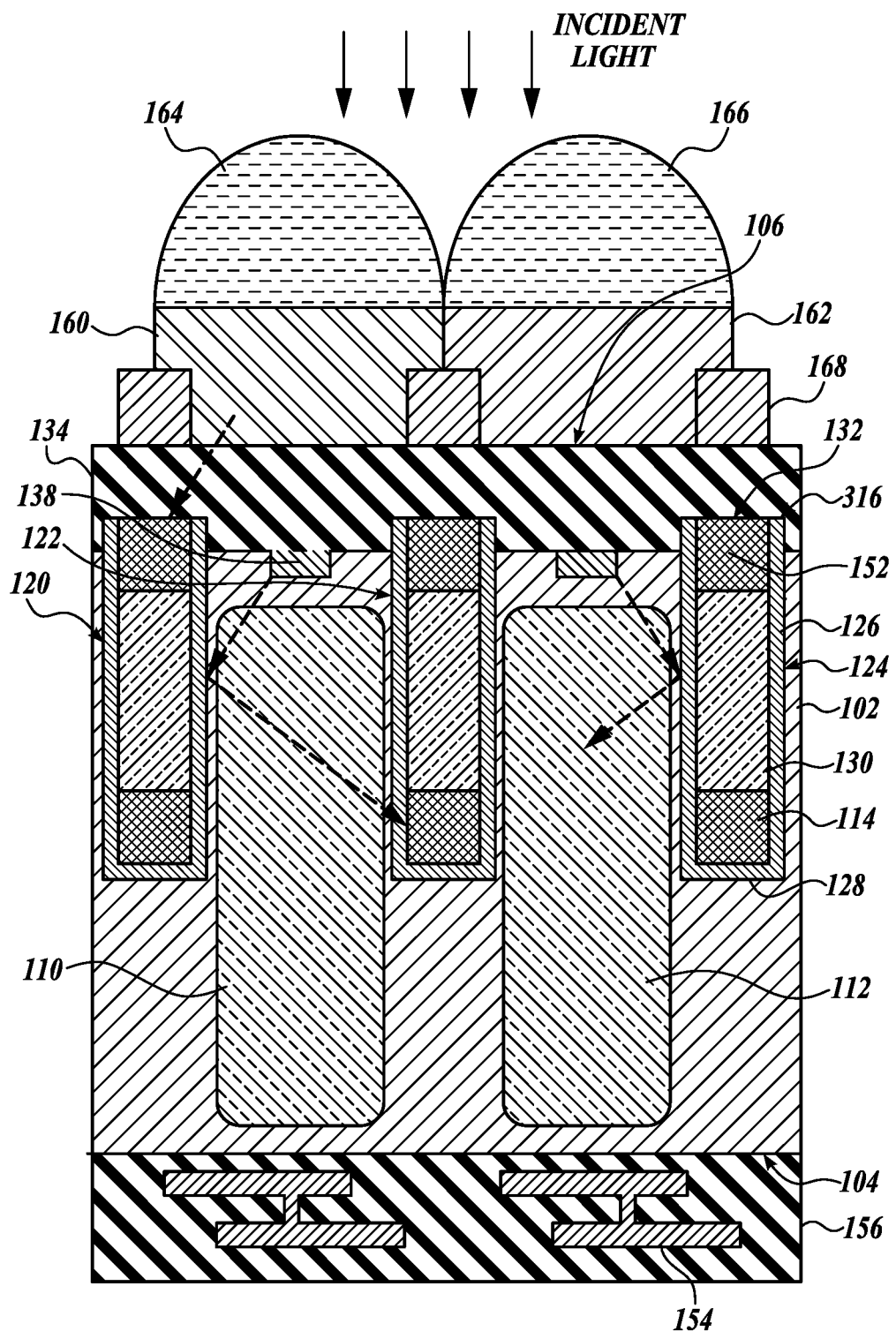
FIG. 3 is a cross-sectional illustration of yet another example of a semiconductor structure having a deep trench isolation structure for a CMOS image sensor in accordance with the teachings of the present invention.

In FIG. 3, an embodiment of a deep trench isolation structure 316 is illustrated that is similar to the embodiment illustrated in FIG. 1 with respect to materials and general dimensions with a difference being that the deep trench isolation structure 316 further includes a second light absorption region 152, wherein the second light absorption region 152 is disposed at a second end 132 of the deep trench isolation structure 316 toward the second side 106 of the semiconductor substrate 102. Thus, the light reflective region 130 is disposed between the first light absorption region 114 and the second light absorption region 152.

In operation, during an exposure period where photodiodes 110, 112 are exposed to light to photogenerate charges in response to incident light entering the second side 106, the first light absorption region 114 absorbs stray light formed of light with a high incident angle toward the bottom of deep trench isolation structure 316 (i.e., portion at the greatest depth with respect to second side 106) preventing the stray light portion of incident light from crosstalk over to neighboring photodiodes through the bottom of the deep trench isolation structure 316 interfering with the light sensing operation of neighboring photodiodes, while the second light absorption region 152 absorbs stray light formed of light with high incident angle at the top of deep trench isolation structure 316 (i.e., portion at the lowest depth with respect to second side 106) preventing the incident light (for example, a stray light reflected by a metal structure of metal grid 168 that may crossover to neighboring photodiode) from crosstalk over to neighboring photodiode through the top portion of the deep trench isolation structure. Such that optical crosstalk between adjacent photodiodes, for example between photodiodes 110 and 112 may be reduced or eliminated.

In embodiments, the pixel structure 100 of each of FIG. 1, FIG. 2, and FIG. 3 may have one or more inter-layer dielectric layers 156, pixel circuitry (e.g., pixel transistors, floating diffusion region) for the photodiodes, and metal interconnection structure 154 formed on the first side 104 (front side). The one or more inter-layer dielectric layer 156 enclosed the pixel circuitry (e.g., pixel transistors, floating diffusion region) and the metal interconnection structure 154. In embodiments, the one or more inter-layer dielectric layer 156 may function as moisture barrier preventing diffusion of moisture to the pixel circuitry and the metal interconnection structure.

The pixel structure 100 of each of FIG. 1, FIG. 2, and FIG. 3 can further include a plurality of cell deep trench isolation (C-DTI) structures 138 formed on the second side 106 of the semiconductor substrate 102. Each of C-DTI structures 138 is disposed in the semiconductor substrate 102 between any two trenches 120, 122, 124 of deep trench isolation structure 116, and above a corresponding photodiode 110, 112 with respect to the second side 106. Alternatively, each of the plurality of C-DTI structures 138 is positioned in regions enclosed by the deep trench isolation structure 116 above a corresponding photodiode 110, 112, and being surrounded by the deep trench isolation structure 116. Each C-DTI 138 may include a cell trench extending a second distance from a surface of the second side 106 into the semiconductor substrate 102 and the second distance is less than the trench depth of a trench (e.g., trench 120, 122, 124) of the deep trench isolation structure 116. In one embodiment, the second distance may range from 0.3 μm to 1 μm. In one embodiment, each of C-DTI structures 138 is positioned between photodiodes 110, 112 and the second side 106 of the semiconductor substrate 102. Each C-DTI 138 may have a dielectric material filling. In one embodiment, the dielectric material filling may include material having an index of refraction lower than the index of refraction of surrounding semiconductor substrate 102 such that there is total internal reflection of incident light reflecting incident light within the photodiode region of the respective photodiode. In one embodiment, the light absorption region 114 is positioned deeper than the each C-DTI 138 with respect to the second side 106 to absorb stray light while not causing much impact to the quantum efficiency of the respective photodiode.

FIGS. 4 to 7 illustrate one embodiment of a process for making a deep trench isolation structure 116 for a CMOS image sensor.

Figure 4:
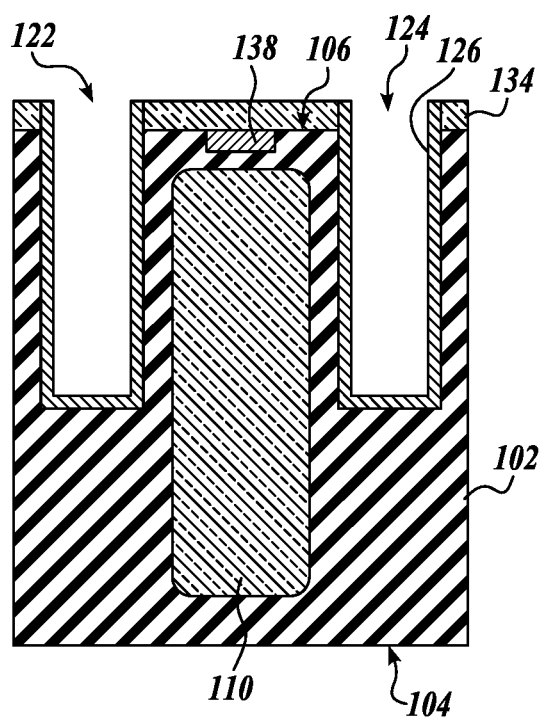
FIGS. 4-11 are cross-sectional illustrations of a semiconductor structure that show an example process for making a deep trench isolation structure for a CMOS image sensor in accordance with the teachings of the present invention.

FIG. 4 illustrates the semiconductor substrate 102 having at least the one trench 124 on which a dielectric layer 126 is deposited on the bottom and sides of the trench 124, and the buffer oxide layer 134 has been deposited on the second side 106 of the semiconductor substrate 102. The semiconductor substrate 102 has a plurality of photodiodes formed therein. For simplicity, only one photodiode 110 is illustrated. The trench 124 remains largely unfilled to receive the light absorption and light reflective materials. The C-DTI 138 is illustrated as already being formed; however, the C-DTI 138 may be formed after the formation of the light absorption and light reflective regions in the trench 122, 124. Various deposition technologies can be used for deposition of the dielectric 126 and buffer oxide 134 layers, such as chemical vapor deposition (CVD), plasma enhanced chemical vapor deposition (PECVD), high density plasma chemical vapor deposition (HDPCVD), atomic layer deposition (ALD), or other suitable deposition technology.

Optionally, a thin barrier layer (not shown), such as titanium (Ti), titanium nitride (TiN), may be deposited into trench 124 by suitable deposition method. The thin barrier layer is formed on the dielectric layer 126 with appropriate thickness that leaves a recess in the trench 124 for subsequent light absorption material 118 deposition, preventing metal ions from diffusing into the semiconductor substrate 102

Figure 5:
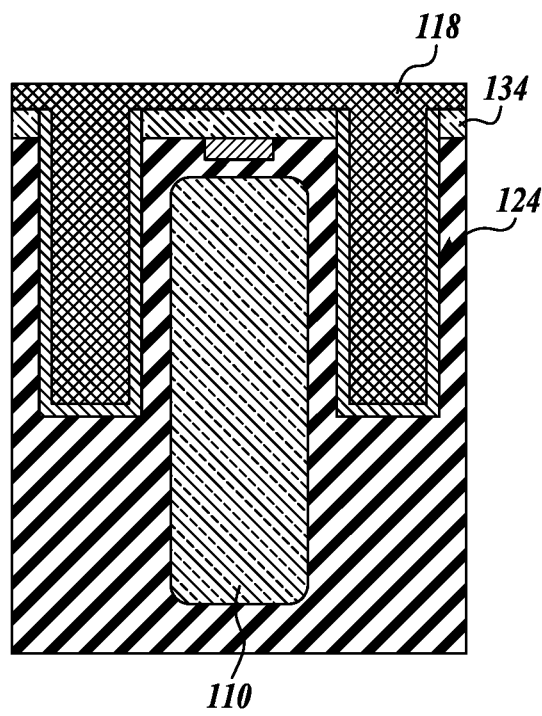

Next, a light absorption material 118 is deposited on the structure illustrated in FIG. 4. The light absorption material 118 is blanket deposited to a depth that exceeds the depth of the trench 124 and forms a layer over the buffer oxide layer 134. A sputtering process, for example, can be used for deposition of a metallic light absorption material 118. Next, a chemical mechanical polishing step is employed on the light absorption material 118. The result is illustrated in FIG. 5.

Figure 6:
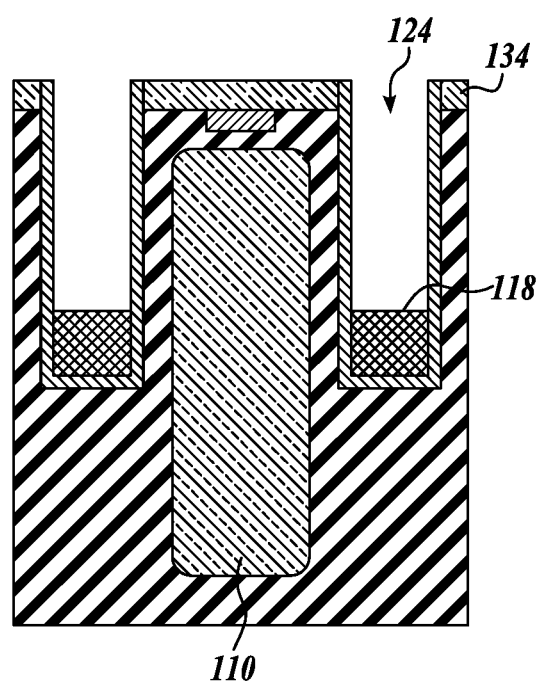

Next, a dry or wet etching step is used to remove the light absorption material 118 to the level of the buffer oxide layer 134 and to reduce the height or thickness of light absorption material 118 in the trench 124 to the appropriate depth level, leaving the light absorption material 118 at the bottom of trench 124 occupying 5-15% of the bottom of trench 124 forming light absorption region. The result is illustrated in FIG. 6. If the light absorption material 118 is metal, such as tungsten, a dry etch, such as reactive ion etching may be employed. For other materials or non-metals, a wet etch may be employed.

Figure 7:
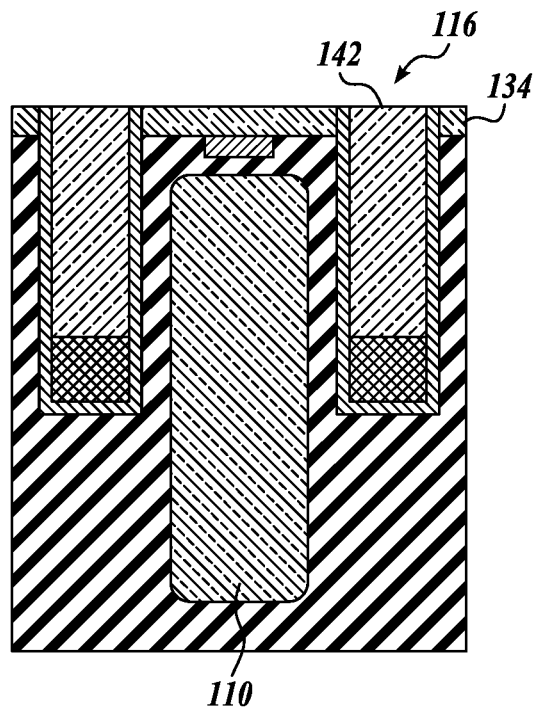

Next, the light reflective material 142 is deposited in the trench 124 using any technique suitable for the purpose. The light reflective material 142 is deposited on the light absorption material 118 at the bottom of the trench 124 to completely fill the trench 124 with the light reflective material 142 to a depth that is at least level with the top of the buffer layer 134 forming light reflective region. Then, chemical mechanical polishing may be employed to reduce the light reflective material 142 to the buffer oxide layer 134. The result is illustrated in FIG. 7.

In one embodiment, if a second light absorption region 152 as in FIG. 3 is to be added on the light reflective material 142, an etching step, or any other suitable technique, may be employed to reduce the light reflective material 142 to the appropriate depth to leave sufficient depth in the trench 124 to fill with the second light absorption material 152.

FIGS. 4 and 8 to 11 illustrate one embodiment of making a deep trench isolation structure for a CMOS image sensor.

Figure 8:
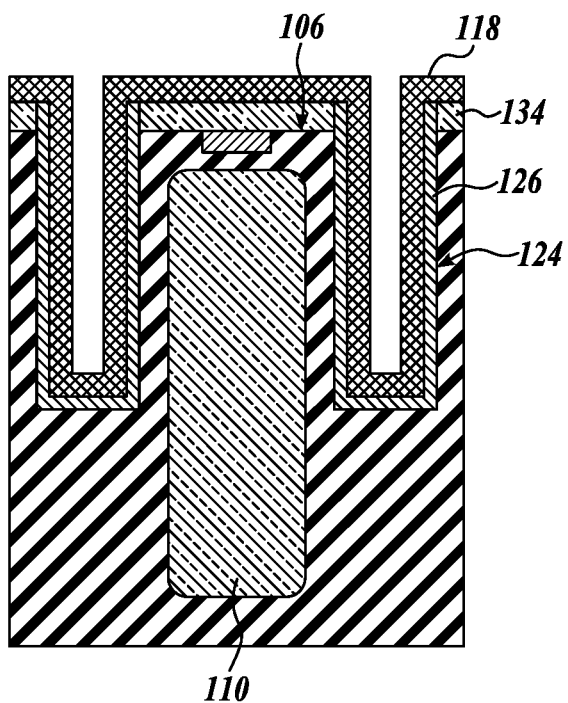

Starting with the structure of FIG. 4 in which the dielectric layer 126 has been fabricated on the bottom and sides of the trench 124, and the buffer oxide layer 134 has been fabricated on the second side 106 of the semiconductor substrate 102, the light absorption material 118 is deposited on such structure as a layer having a thickness less than half the width of the trench 124, so that a recess remains in the trench 124. The result is illustrated in FIG. 8. In one embodiment, the deposition process for the light absorption material 118 is atomic layer deposition (ALD).

Figure 9:
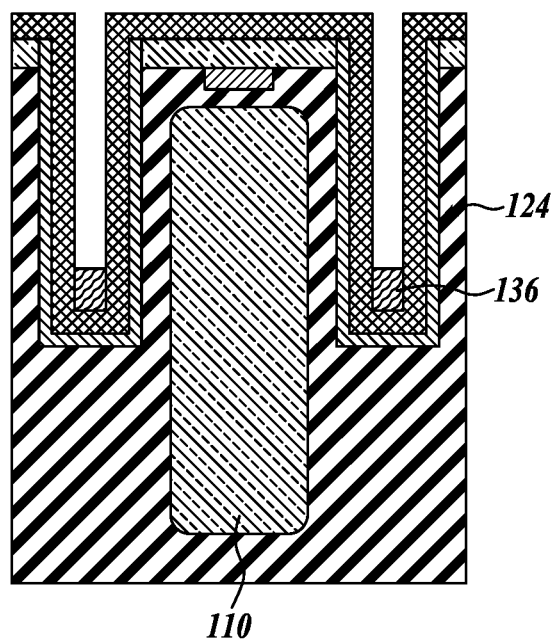

Next, FIG. 9 illustrates a sacrificial organic planarization layer 136 that is deposited into trench 124. In one example, any excess portion of the organic planarization layer 136 material that is deposited into trench 124 is removed to leave a remaining portion of the organic planarization layer 136 at the bottom of trench 124 as shown. In one example, the depth of the portion of the organic planarization layer 136 that remains at the bottom of trench 124 as shown in FIG. 9 is a depth that is approximately equal to a depth of a recess 140 to be formed in light ab sorption material 118.

Figure 10:
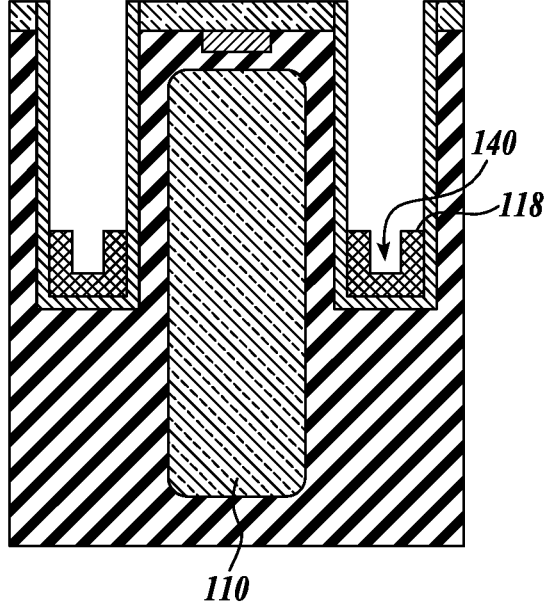

Next, a dry or wet etch is used to reduce the light absorption material 118 on the sides of the trench 124, leaving organic planarization layer 136 and the light absorption material 118 at the bottom of trench 124 to the appropriate depth. Next, the remaining portion of the sacrificial organic planarization layer 136 at the bottom of trench 124 is removed, which results in the recess 140 in the light absorption material 118 at the bottom of trench 124 as illustrated in FIG. 10 forming light absorption region. If the light absorption material 118 is metal, such as tungsten, a dry etch, such as reactive ion etching may be employed. For other materials or non-metals, a wet etch may be employed. The result of the etch step is illustrated in FIG. 10. Thus, in the depicted example, the use of atomic layer deposition and organic planarization layer results in a recess 140 in the light absorption region 118.

Figure 11:
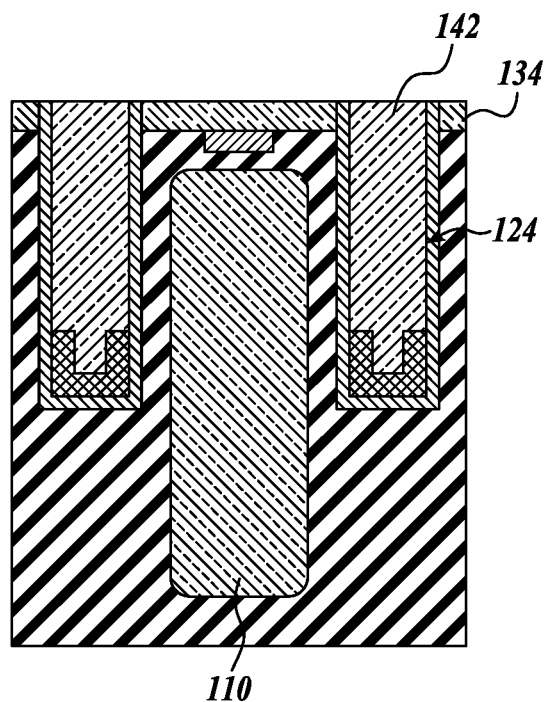

Next, the light reflective material 142 is deposited in the trench 124 using any technique suitable for the purpose. The light reflective material 142 is deposited on the light absorption material 118 and into recess 140 at the bottom of the trench 124 to completely fill the trench 124 with the light reflective material 142 to a depth that is at least level with the top of the buffer oxide layer 134 forming light reflective region. Then, chemical mechanical polishing may be employed to reduce the light reflective material to the buffer oxide layer 134. The result is illustrated in FIG. 11.

In one embodiment, if a second light absorption region 152 is to be added on the light reflective material 142, an etching step, or any other suitable technique, may be employed to reduce the first light reflective material 142 to the appropriate depth to leave sufficient depth in the trench 124 to fill with the second light absorption material 152.

Figure 12:
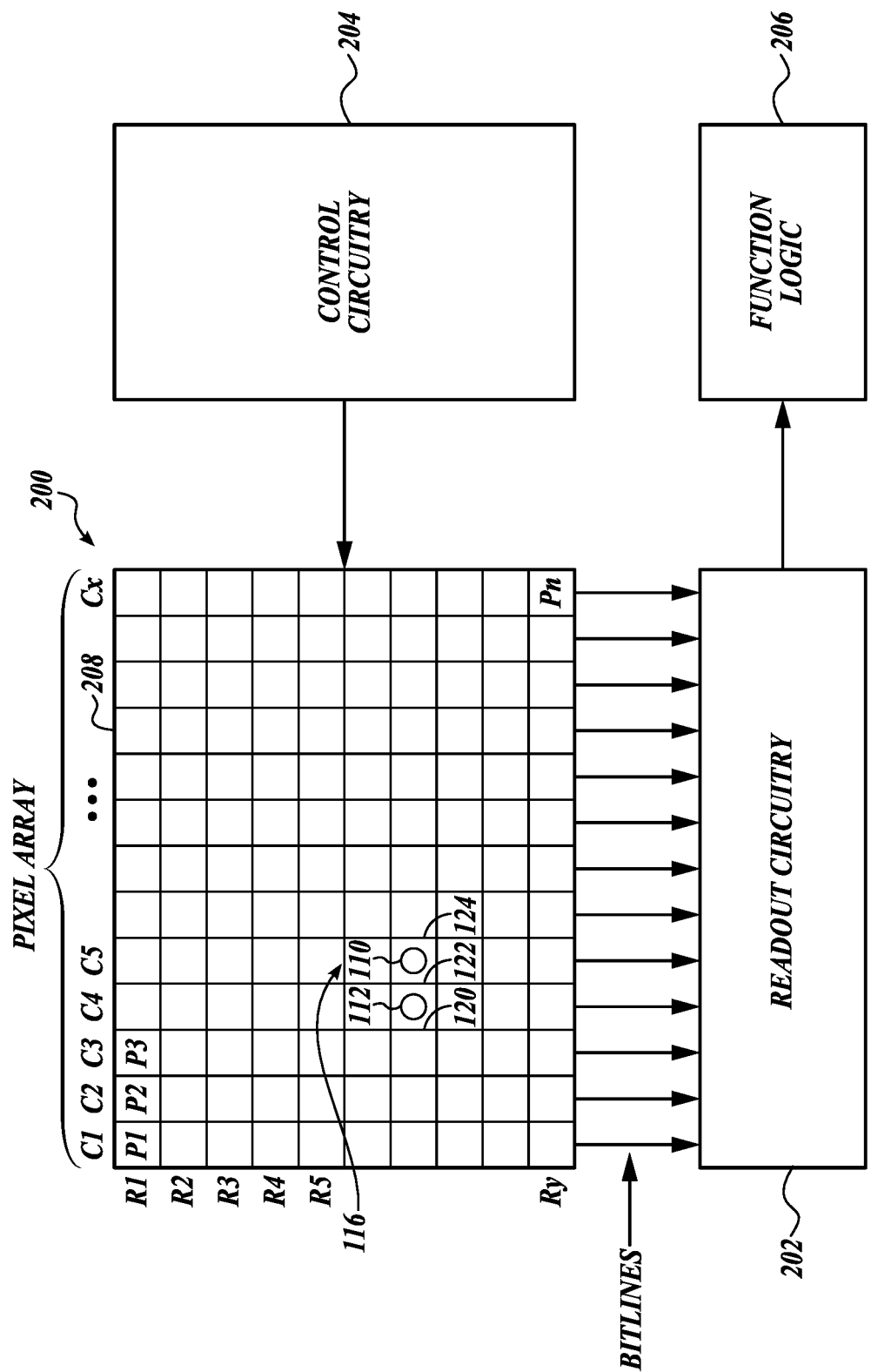
FIG. 12 is a diagram illustrating one example of an imaging sensor including a pixel array having pixel cells with deep trench isolation structures in accordance with the teachings of the present invention.

FIG. 12 is a block diagram illustrating one example of imaging sensor 200 that can have the deep trench isolation structure 116 according to any of the embodiments and examples. Imaging sensor 200 includes pixel array 208, control circuitry 204, readout circuitry 202, and function logic 206. As mentioned above, in one example, pixel array 208 is a two-dimensional (2D) array of photodiodes, or image sensor pixels (e.g., pixels P1, P2 . . . , Pn). As illustrated, photodiodes, such as photodiodes 110 and 112, are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations. Photodiodes 110 and 112 are optically and electrically isolated by the series of trenches of the illustrated deep trench isolation structures 116, 216, and 316 in FIG. 1, FIG. 2, and FIG. 3, respectively In one example, after the image sensor photodiode/pixel in pixel array 208 has acquired its image data or image charge, the image data is readout by readout circuitry 202 and then transferred to function logic 206. In various examples, readout circuitry 202 may include amplification circuitry, analog-to-digital (ADC) conversion circuitry, or otherwise. Function logic 206 may simply store the image data or even manipulate the image data by applying post image effects (e.g., crop, rotate, remove red eye, adjust brightness, adjust contrast, or otherwise). In one example, readout circuitry 202 may read out a row of image data at a time along readout column lines (illustrated) or may readout the image data using a variety of other techniques (not illustrated), such as a serial readout or a full parallel readout of all pixels simultaneously.

In one example, control circuitry 204 is coupled to pixel array 208 to control operation of the plurality of photodiodes in pixel array 208. For example, control circuitry 204 may generate a shutter signal for controlling image acquisition. In one example, the shutter signal is a global shutter signal for simultaneously enabling all pixels within pixel array 208 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging sensor 200 may be included in a digital camera, cell phone, laptop computer, automobile or the like. Additionally, imaging sensor 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging sensor 200, extract image data from imaging sensor 200, or manipulate image data supplied by imaging sensor 200.

The above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel structure for a CMOS image sensor, comprising:
   a semiconductor substrate having a first side and a second side opposite to the first side;
   a photodiode disposed in the semiconductor substrate proximate to the first side, wherein the photodiode accumulates image charge photogenerated in the photodiode in response to incident light directed through the second side; and
   a deep trench isolation structure enclosing a semiconductor region in the semiconductor substrate having the photodiode disposed therein, wherein the deep trench isolation structure extends from the second side toward the first side, wherein the deep trench isolation structure includes a light absorption region disposed at a first end of the deep trench isolation structure toward the first side, wherein the deep trench isolation structure further includes a light reflective region disposed between the light absorption region and a second end of the deep trench isolation structure toward the second side.

2. The pixel structure of claim 1, wherein the light absorption region is a first light absorption region, wherein the deep trench isolation structure further includes a second light absorption region, wherein the second light absorption region is disposed at the second end of the deep trench isolation region toward the second side, and wherein the light reflective region is disposed between the first light absorption region and the second light absorption region.

3. The pixel structure of claim 1, wherein the light reflective region comprises a metal selected from the group consisting of aluminum, copper, silver, platinum, alloys, and a combination thereof.

4. The pixel structure of claim 1, wherein the light absorption region comprises a metal or metal compound selected from the group consisting of tungsten, titanium, titanium nitride, aluminum, nickel, alloys, and a combinations thereof.

5. The pixel structure of claim 1, wherein the light absorption region comprises the region from 5% to 15% of a length of the deep trench isolation structure between the first side and the second side.

6. The pixel structure of claim 1, wherein the light absorption region has a depthwise dimension of 1000 Å to 7500 Å.

7. The pixel structure of claim 1, wherein a length of the deep trench isolation structure is less than a thickness of the semiconductor substrate between the first side and the second side.

8. The pixel structure of claim 7, wherein a region between a first end of the deep trench isolation structure toward the first side and the first side is comprised of the semiconductor substrate.

9. The pixel structure of claim 1, wherein the deep trench isolation structure includes a four-sided structure having a trench on each lateral side, wherein each trench is orthogonal to the first side and the second side, and wherein each trench intersects two other trenches at right angles.

10. The pixel structure of claim 9, wherein the light absorption region comprises a layer having a width less than a half a width of each trench to define a recess in each trench proximate to a surface of the light absorption region.

11. The pixel structure of claim 1, comprising a cell deep trench isolation structure disposed in the semiconductor region of the semiconductor substrate and enclosed by the deep trench isolation structures; wherein the cell deep trench isolation structure is disposed between the photodiode and the second side, the cell deep trench isolation structure is extended from the second side into the semiconductor substrate with a cell trench depth being less than a trench depth of each trench of the deep trench isolation structure.

12. The pixel structure of claim 1, wherein the deep trench isolation structure comprises a dielectric layer juxtaposed next to the semiconductor substrate and the light absorption region is disposed on the dielectric layer.

13. The pixel structure of claim 12, wherein the dielectric layer comprises an oxide or nitride selected from the group consisting of silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$).

14. The pixel structure of claim 1, wherein the first side is a front side of the semiconductor substrate and wherein the second side is a backside of the semiconductor substrate.

15. A pixel structure for a CMOS image sensor, comprising:
   a semiconductor substrate having a first side and a second side opposite to the first side;
   a photodiode disposed in the semiconductor substrate proximate to the first side, wherein the photodiode accumulates image charge photogenerated in the photodiode in response to incident light directed through the second side; and
   a deep trench isolation structure enclosing a semiconductor region in the semiconductor substrate having the photodiode disposed therein, wherein the deep trench isolation structure extends from the second side toward the first side, wherein the deep trench isolation structure includes a light absorption region disposed distal to the second side through which the incident light is directed, wherein a depthwise dimension of the light absorption region is less than a depth of the deep trench isolation structure.

16. The pixel structure of claim 15, wherein the deep trench isolation structure further includes a light reflective region disposed between the light absorption region and a second end of the deep trench isolation structure toward the second side.

17. The pixel structure of claim 16, wherein the light absorption region is a first light absorption region, wherein the deep trench isolation structure further includes a second light absorption region, wherein the second light absorption region is disposed at the second end of the deep trench isolation region toward the second side, and wherein the light reflective region is disposed between the first light absorption region and the second light absorption region.

18. The pixel structure of claim 16, wherein the light reflective region comprises a metal selected from the group consisting of aluminum, copper, silver, platinum, alloys, and a combination thereof.

19. The pixel structure of claim 15, wherein the light absorption region comprises the region from 5% to 15% of a length of the deep trench isolation structure between the first side and the second side.

20. The pixel structure of claim 15, comprising a cell deep trench isolation structure disposed in the semiconductor region of the semiconductor substrate and enclosed by the deep trench isolation structures; wherein the cell deep trench isolation structure is disposed between the photodiode and the second side, the cell deep trench isolation structure is extended from the second side into the semiconductor substrate with a cell trench depth being less than a trench depth of each trench of the deep trench isolation structure.

21. The pixel structure of claim 15, wherein the deep trench isolation structure includes a four-sided structure having a trench on each lateral side, wherein the light absorption region comprises a layer having a width less than a half a width of each trench to define a recess in each trench proximate to a surface of the light absorption region.

\* \* \* \* \*

UNITED STATES PATENT AND TRADEMARK OFFICE
CERTIFICATE OF CORRECTION

PATENT NO. : 11,244,979 B2
APPLICATION NO. : 16/720236
DATED : February 8, 2022
INVENTOR(S) : H. Zang et al.

Page 1 of 1

It is certified that error appears in the above-identified patent and that said Letters Patent is hereby corrected as shown below:

In the Claims

| Column | Line | |
|---|---|---|
| 12 | 48 & 49 | Claim 4, change "a combinations" to -- combinations --. |

Signed and Sealed this
Second Day of January, 2024

Katherine Kelly Vidal
*Director of the United States Patent and Trademark Office*